(12) United States Patent
Jou

(10) Patent No.: US 8,643,111 B1
(45) Date of Patent: Feb. 4, 2014

(54) ELECTROSTATIC DISCHARGE (ESD) PROTECTION DEVICE

(75) Inventor: Yeh-Ning Jou, New Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 31 days.

(21) Appl. No.: 13/591,861

(22) Filed: Aug. 22, 2012

(51) Int. Cl.
*H01L 29/93* (2006.01)

(52) U.S. Cl.
USPC ........... 257/355; 257/213; 257/277; 257/360; 257/E21.409; 257/E29.242

(58) Field of Classification Search
None
See application file for complete search history.

(56) References Cited

U.S. PATENT DOCUMENTS

| | | | | |
|---|---|---|---|---|
| 5,493,142 | A * | 2/1996 | Randazzo et al. | 257/328 |
| 7,671,416 | B1 * | 3/2010 | O et al. | 257/360 |
| 7,863,147 | B2 * | 1/2011 | Lin et al. | 438/301 |
| 8,049,307 | B2 * | 11/2011 | Jou et al. | 257/556 |
| 2001/0031552 | A1 * | 10/2001 | Gauthier et al. | 438/655 |
| 2006/0092592 | A1 * | 5/2006 | Huang | 361/220 |
| 2006/0237794 | A1 * | 10/2006 | Husher | 257/355 |
| 2007/0090414 | A1 * | 4/2007 | Sutou et al. | 257/277 |
| 2008/0142849 | A1 * | 6/2008 | Alvarez et al. | 257/213 |
| 2013/0020645 | A1 * | 1/2013 | Campi et al. | 257/355 |
| 2013/0026576 | A1 * | 1/2013 | Stockinger | 257/355 |
| 2013/0157433 | A1 * | 6/2013 | Zhan et al. | 438/330 |
| 2013/0264640 | A1 * | 10/2013 | Salman et al. | 257/343 |

* cited by examiner

*Primary Examiner* — Minh-Loan T Tran
*Assistant Examiner* — Fazli Erdem
(74) *Attorney, Agent, or Firm* — Birch, Stewart, Kolasch & Birch, LLP

(57) ABSTRACT

An electrostatic discharge (ESD) protection device is provided. The ESD protection device includes an epitaxy layer disposed on a semiconductor substrate. An isolation pattern is disposed on the epitaxy layer to define a first active region and a second active region, which are surrounded by a first well region. A gate is disposed on the isolation pattern. A first doped region and a second doped region are disposed in the first active region and the second active region, respectively. A drain doped region is disposed in the first doped region. A source doped region and a first pick-up doped region are disposed in the second doped region. A source contact plug having an extended portion connects to the source doped region. A ratio of an area of the extended portion covering the first pick-up doped region to an area of first pick-up doped region is between zero and one.

11 Claims, 7 Drawing Sheets

US 8,643,111 B1

ELECTROSTATIC DISCHARGE (ESD) PROTECTION DEVICE

BACKGROUND OF THE INVENTION

1. Field of the Invention

The present invention relates to an electrostatic discharge (ESD) protection device, and in particular, to an electrostatic discharge (ESD) protection device with the ability to adjust holding voltage and trigger voltage.

2. Description of the Related Art

In conventional high voltage device processes, a holding voltage of an electrostatic discharge (ESD) protection device usually is not larger than an operation voltage (VDD) of a device. Therefore, when integrated circuit devices are operated under normal operating conditions, unwanted transients, such as current and voltage surges, result in latch-up events which damage devices. However, the conventional ESD protection device is improved to increase the holding voltage, the trigger voltage simultaneously increases. Therefore, the conventional ESD protection device with improved holding voltage still can not protect the internal circuits of the device.

Thus, an electrostatic discharge (ESD) protection device with the ability to adjust holding voltage and trigger voltage is desired to solve the aforementioned problems.

BRIEF SUMMARY OF INVENTION

An electrostatic discharge (ESD) protection device is provided. An exemplary embodiment of an electrostatic discharge (ESD) protection device comprises a semiconductor substrate having a first conductive type. An epitaxy layer having the first conductive type is disposed on the semiconductor substrate. An isolation pattern is disposed on the epitaxy layer to define a first active region and a second active region. A first well region is disposed in the epitaxy layer, surrounding the first active region and the second active region, wherein the first well has a second conductive type opposite to the first conductive type. A gate is disposed on the isolation pattern, between the first active region and the second active region. A first doped region is disposed in the first active region, on the first well, wherein the first doped region has the second conductive type. A second doped region is disposed in the second active region, on the first well, wherein the second doped region has the first conductive type. A drain doped region is disposed in the first doped region. A source doped region and a first pick-up doped region adjacent to each other are disposed in the second doped region, wherein the source doped region has the second conductive type, and the first pick-up doped region has the first conductive type. A source contact plug connects to the source doped region, wherein the source contact plug has an extended portion, and a ratio of an area of the first pick-up doped region covered by the extended portion to an area of first pick-up doped region is between zero and one from a top viewpoint.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
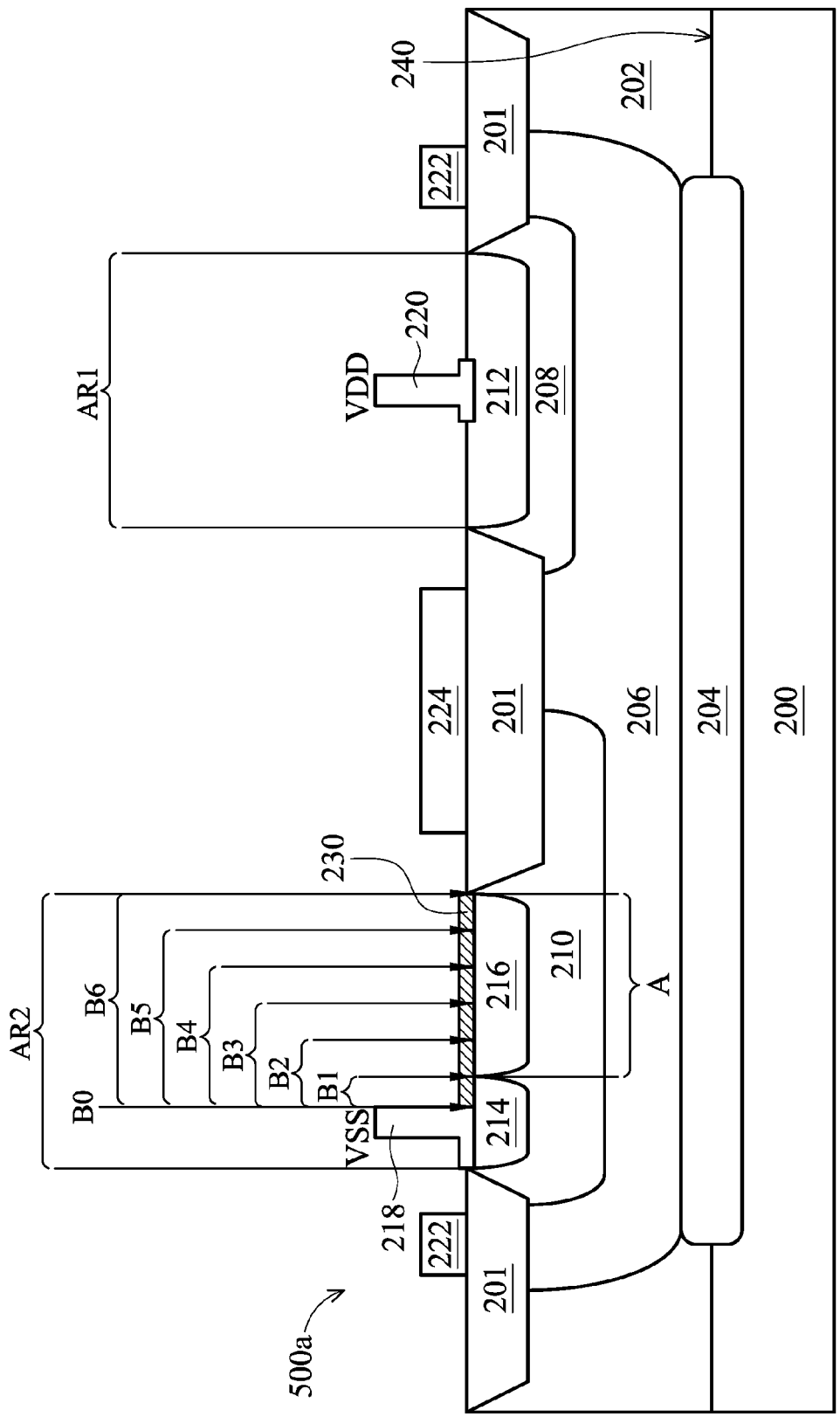
FIG. 1 is a cross section of one embodiment of an electrostatic discharge (ESD) protection device of the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

FIG. 1 is a cross section of one embodiment of an electrostatic discharge (ESD) protection device 500a of the invention. In this embodiment, the ESD protection device 500a may serve as an insulated gate bipolar transistor electrostatic discharge (IGBT-ESD) protection device 500a. The ESD protection device 500a may include a semiconductor substrate 200, an epitaxy layer 202, a first well 206, a first doped region 208, a second doped region 210, a drain doped region 212, a source doped region 214, a first pick-up region 216 adjacent to the source doped region 214, a gate structure 224 and a source contact plug 218. The source contact plug 218 has an extended portion 230 with an adjustable dimension to change an area of the source active region covered by the extended portion 230. In one embodiment, the drain doped region 212 may be coupled to an operation voltage (VDD) of a device, and the source doped region 214 or both the source doped region 214 and the first pick-up region 216 may be coupled to a ground reference voltage (VSS).

In one embodiment, the semiconductor substrate 200 may comprise a silicon substrate. Alternatively, SiGe, a bulk semiconductor, a strained semiconductor, a compound semiconductor or other commonly used semiconductor substrates may be used as the semiconductor substrate 200. In one embodiment, the semiconductor substrate 200 may be doped with P-type or N-type dopants to change its conductive type according to customer designs. In this embodiment, the semiconductor substrate 200 may have a first conductive type such as P-type. An epitaxy layer 202 is disposed on the semiconductor substrate 200. In this embodiment, the epitaxy layer 202 has the first conductive type such as P-type. In this embodiment, a buried layer 204 is disposed on an interface 240 between the semiconductor substrate 200 and the epitaxy layer 202. The buried layer 204 has a second conductive type such as N-type. Alternatively, the semiconductor substrate 200, the buried layer 204 and the epitaxy layer 202 may respectively serve as a base, a buried oxide layer and an epitaxy layer of a silicon-on-insulator (SOI) substrate.

As shown in FIG. 1, isolation patterns 201 are disposed on the epitaxy layer 202 to define a first active region AR1 and a second active region AR2. In one embodiment, the isolation patterns 201 may be shallow trench isolation (STI) features. In this embodiment, the first active region AR1 may serve as a drain active region of the ESD protection device 500a, and the second active region AR2 may serve as a source active region of the ESD protection device 500a.

As shown in FIG. 1, the first well 206 is disposed in the epitaxy layer 202, surrounding the first active region AR1 and the second active region AR2. In one embodiment, the first well 206 has the second conductive type such as N-type. For example, the first well 206 may serve as a high voltage N-type well (HVNW) region. As shown in FIG. 1, a bottom of the first well 206 connects to the buried layer 204.

As shown in FIG. 1, the gate structure 224 of the ESD protection device 500a is disposed on the isolation pattern 201, between the first active region AR1 and the second active region AR2. Additionally, the gate structure 224 is disposed within a boundary of the isolation pattern 201 without extending above the first active region AR1 or the second active region AR2. In one embodiment, the gate structure 224 may be constructed by a lower gate insulating layer and an upper gate layer. The gate insulating layer may comprise commonly used dielectric materials such as oxide, nitride, oxynitride, oxycarbide or combinations thereof. Also, the gate insulating layer may comprise high-dielectric constant (k) dielectric materials such as aluminum oxide ($Al_2O_3$), hafnium oxide ($HfO_2$), hafnium oxynitride (HfON), hafnium silicate (HfSiO$_4$), zirconium oxide, ($ZrO_2$), zirconium oxynitride (ZrON), zirconium silicate ($ZrSiO_4$), yttrium oxide ($Y_2O_3$), lanthalum oxide ($La_2O_3$), cerium oxide ($CeO_2$), titanium oxide ($TiO_2$), tantalum oxide ($Ta_2O_5$) or combinations thereof. Further, the gate layer may comprise silicon or polysilicon. The gate layer may be doped with dopants to reduce a sheet resistance thereof. Alternatively, the gate layer may comprise amorphous silicon. As shown in FIG. 1, a first doped region 208 and a second doped region 210 are disposed in the first active region AR1 and the second active region AR2, respectively. Both the first doped region 208 and a second doped region 210 are disposed above the first well 206. The first doped region 208 and a second doped region 210 are adjacent to opposite sides of the gate structure 224. In one embodiment, the first doped region 208 has the second conductive type such as N-type. For example, the first doped region 208 may serve as an N-type drift drain doped region 208, which is used as a portion of a drain of the ESD protection device 500a. As shown in FIG. 1, the first doped region 208 extends toward to the gate structure 224, and overlaps with the isolation pattern 201 under the gate structure 224. A vertical boundary of the first doped region 208 substantially aligns to a side of the gate structure 224. In one embodiment, the second doped region 210 has the first conductive type such as P-type. For example, the second doped region 210 may serve as a P-type body doped region 210 which is used as a channel region and a portion of a source of the ESD protection device 500a. As shown in FIG. 1, the second doped region 210 extends toward to the gate structure 224, overlapping with the isolation pattern 201 under the gate structure 224. A vertical boundary of the second doped region 210 is substantially and directly under the gate structure 224. Additionally, the ESD protection device 500a further comprises a semiconductor ring structure 222, which is ring shaped from a top viewpoint, disposed on the isolation pattern 201 above a boundary of the first well 206. The semiconductor ring structure 222 is separated from the gate structure 224 by the first active region AR1 and the second active region AR2 to increase a breakdown voltage (VBD) of the device. In one embodiment, the semiconductor ring structure 222 may be formed of materials which are the same as the gate structure 224, and the semiconductor ring structure 222 and the gate structure 224 may be simultaneously formed in one process step. In this embodiment, the semiconductor ring structure 222 may be a poly ring.

As shown in FIG. 1, the drain doped region 212 of the ESD protection device 500a is disposed within the first doped region 208, and a boundary of the drain doped region 212 is surrounded by the first doped region 208. In one embodiment, the drain doped region 212 may have a first conductive type such as P-type. For example, the drain doped region 212 may serve as a P-type heavily doped (P+) drain region 210. The boundary of the drain doped region 212 substantially contacts the isolation pattern 201, which is used to define the first active region AR1. Therefore, an area of the drain doped region 212 is substantially the same as that of the first active region AR1 from a top viewpoint.

In one embodiment as shown in FIG. 1, the ESD protection device 500a further comprises the source doped region 214 and the first pick-up region 216 adjacent to each other. The source doped region 214 and the first pick-up region 216 are disposed in the second doped region 210. Also boundaries of the source doped region 214 and the first pick-up region 216 are surrounded by the second doped region 210. In one embodiment, the source doped region 214 may have the second conductive type such as N-type. For example, the source doped region 214 may serve as an N-type heavily doped (N+) source region 214. In one embodiment, the first pick-up region 216 may have a first conductive type such as P-type. For example, the first pick-up region 216 may serve as a P-type body doped region 216. Also, a total area of the source doped region 214 and the first pick-up region 216 is substantially the same as that of the second active region AR2 in a top viewpoint. As shown in FIG. 1, a boundary of the first pick-up region 216 substantially contacts the isolation pattern 201 under the gate structure 224.

As shown in FIG. 1, the source contact plug 218 of the ESD protection device 500a connects to the source doped region 214. The source contact plug 218 is used to connect the source doped region 214 to the ground reference voltage (VSS). In one embodiment, the source contact plug 218 is designed to have an extended portion 230 extending along a surface of the semiconductor substrate 200 to cover the first pick-up region 216. In one embodiment, the extended portion 230 may have an adjustable length, so that a ratio of an area of the first pick-up doped region 216 covered by the extended portion 230 to an area A of the first pick-up doped region 216 is between zero and one from a top viewpoint. That is to say, the area of the first pick-up doped region 216 covered by the extended portion 230 is adjustable. During the fabrication process, the extended portion 230 with various dimensions is formed by tuning an area of a silicide block on the second active region AR2 and a subsequent silicide process. Also, as shown in FIG. 1, a drain contact plug 220 of the ESD protection device 500a connects to the drain doped region 212. The drain contact plug 220 is used to connect the drain doped region 212 to the operation voltage (VDD) of a device.

Figure 2:
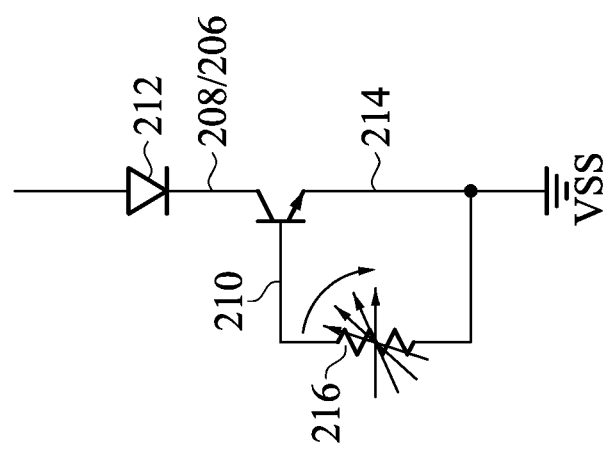
FIG. 2 is an effective circuit diagram of one embodiment of an ESD protection device as shown in FIG. 1.

Next an operation mechanism of one embodiment of an ESD protection device 500a is described. Please refer to FIGS. 1 and 2, wherein FIG. 2 is an effective circuit diagram of one embodiment of an ESD protection 500a device as shown in FIG. 1. As shown in FIGS. 1 and 2, the drain doped region 212 (e.g. P+ drain region) and the first doped region 208 (e.g. N-type drift drain doped region) may collectively construct a P-N junction diode. Also, the drain doped region 212 connects to the operation voltage (VDD) of a device. Further, the first doped region 208 (e.g. N-type drift drain doped region), the first well 206 (e.g. HVHW), the second doped region 210 (e.g. P-type body doped region), and the source doped region 214 (e.g. N+ source region) collectively construct a parasitic NPN bipolar junction transistor (NPN BJT). The first doped region 208 (e.g. N-type drift drain doped region) and the first well 206 (e.g. HVHW) may serve as a collector of the parasitic NPN BJT. The second doped region 210 (e.g. P-type body doped region) may serve as a base of the parasitic NPN BJT. The source doped region 214 (e.g. N+ source region) may serve as an emitter of the parasitic NPN BJT. Further, the collector of the parasitic NPN BJT is coupled to the operation voltage (VDD) of a device, and the emitter of the parasitic NPN BJT is coupled to the ground reference voltage (VSS). Additionally, the first pick-up doped region 216 not covered by the extended portion 230 of the source contact plug 218 may serve as an adjustable parasitic resistor, and two terminals of the adjustable parasitic resistor are respectively electrically connected to the emitter and the base of the parasitic NPN BJT, which collectively serve as a cathode of the ESD protection device. If the parasitic NPN BJT encounters ESD current zapping from VDD, the parasitic NPN BJT would be triggered and provide a transmission path from the VDD to the VSS. Therefore, a high hole injection may be induced from the P-type first doped regions 208a to the P-type substrate 200 through the fourth doped region 212 (e.g. N-type drift doped region). Next, the high hole injection may be injected from the drain doped region 212 (e.g. P+ drain region) to the second doped region 210 (e.g. P-type body doped region) through the first doped region 208 (e.g. N-type drift drain doped region) and the first well 206 (e.g. HVHW), and then the high hole injection may be transmitted to the VSS through the first pick-up doped region 216 (e.g. P-type doped region), which serves as the adjustable parasitic resistor, and source doped region 214 (e.g. N+ source region). Thus, the parasitic NPN BJT would transmit the ESD transient current to the VSS and prevent the internal circuits of a device protected by the ESD protection device 500a from damage.

Figure 3:
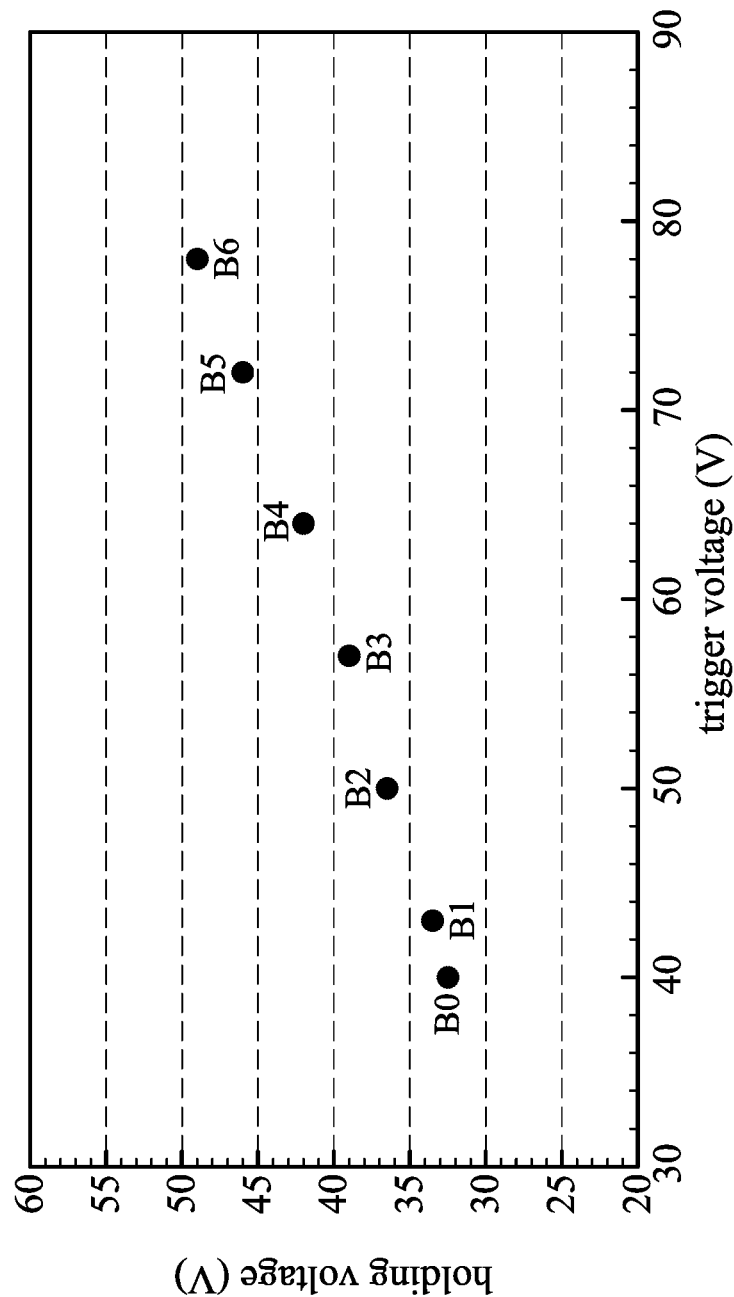
FIG. 3 illustrates various areas of a pick-up doped region covered by an extended portion of one embodiment of an ESD protection device as shown in FIG. 1 and corresponding trigger voltages and holding voltages.

The differences between a trigger voltage and a holding voltage of the ESD protection device 500a may be adjustable by tuning the area of the first pick-up doped region 216 covered by the extended portion 230 of the source contact plug 218 to change the resistance value of the parasitic resistor connected to the cathode of the ESD protection device 500a. Please refer to FIGS. 1-3, wherein FIG. 3 illustrates various areas of a pick-up doped region 216 covered by an extended portion 230 of one embodiment of an ESD protection device 500a as shown in FIG. 1 and corresponding trigger voltages and holding voltages. When the extended portion 230 is respectively located on positions B0 and B1 (that is to say, the extended portion 230 partially or fully covers the source doped region 214 without covering the pick-up doped region 216), the trigger voltages of the ESD protection device 500a are respectively 40V and 43V, and the holding voltages of the ESD protection device 500a are respectively 33V and 34V. Additionally, when a position of the extended portion 230 is tuned from a position B6 and to the position B1 (that is to say, the area of the first pick-up doped region 216 covered by the extended portion 230 is reduced), the parasitic resistance of the ESD protection device 500a increases. As shown in FIG. 3, when the area of the first pick-up doped region 216 covered by the extended portion 230 is reduced, the reduced range of the trigger voltage is larger than that of the holding voltage of the ESD protection device 500a. For example, when the extended portion 230 covers the first pick-up doped region 216 (the extended portion 230 extends to the position B6), the trigger voltage and the holding voltage of the ESD protection device 500a are respectively 79V and 49V. When the first pick-up doped region 216 is fully exposed without being covered by the extended portion 230 (the extended portion 230 extends to the position B1), the trigger voltage and the holding voltage of the ESD protection device 500a are respectively 43V and 34V. The differences between the trigger voltage and the holding voltage of the ESD protection device 500a is reduced by tuning the area of the first pick-up doped region 216 covered by the extended portion 230 of the source contact plug 218. Compared with the conventional ESD protection device, the ESD protection device 500a can improve the holding voltage and moderate the increase of the trigger voltage of the ESD protection device 500a without having to laminate with several ESD protection devices. When the device is operated under normal operating voltage, the ESD protection device 500a can avoid the situation where the device triggers the ESD protection device. Therefore, the ESD protection device 500a can avoid the situation where a latch-up phenomenon occurs, which damages the internal circuits of a device due to the triggered ESD protection device. The performance of the ESD protection device can be improved.

Figure 4:
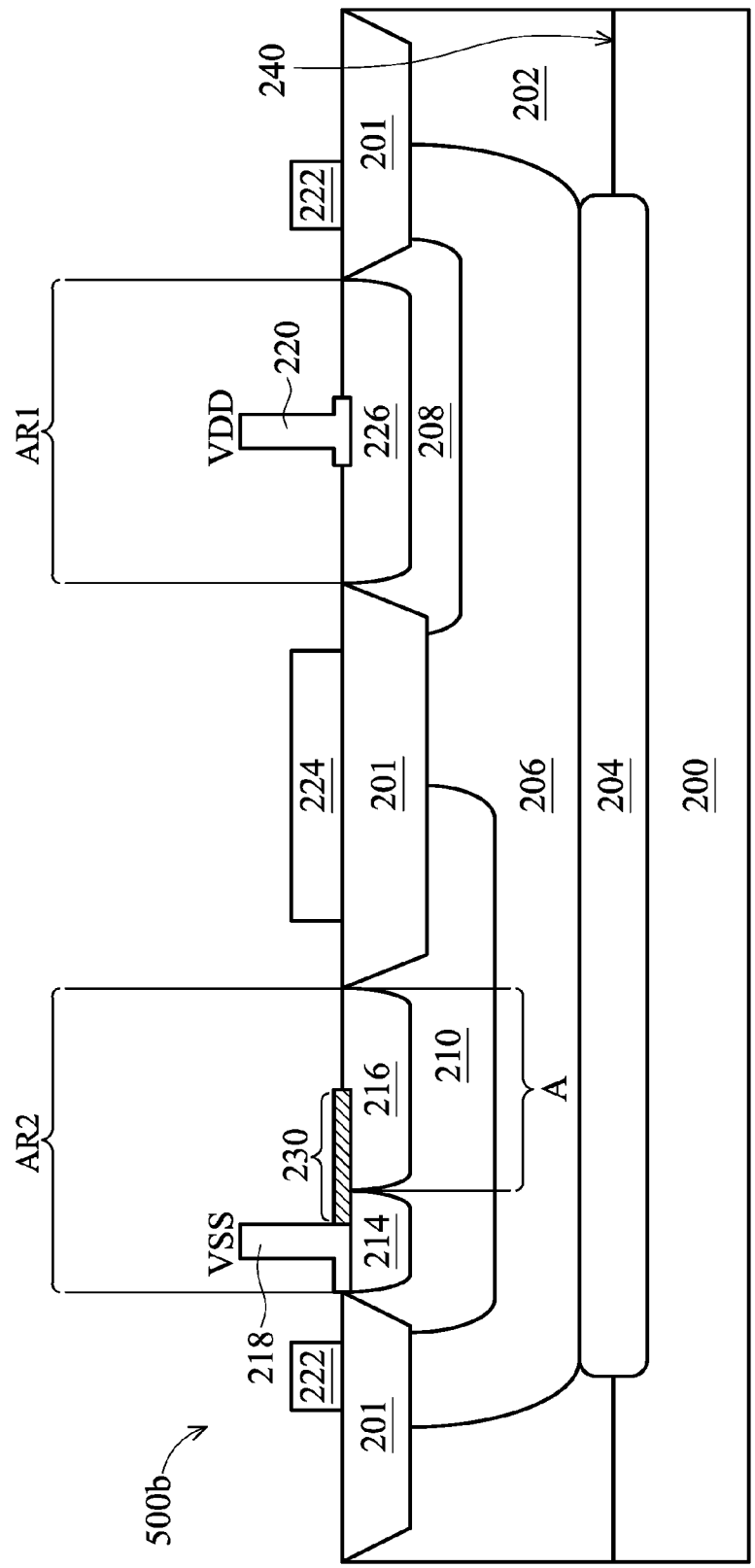
FIG. 4 is a cross section of another embodiment of an electrostatic discharge (ESD) protection device of the invention.
Figure 5:
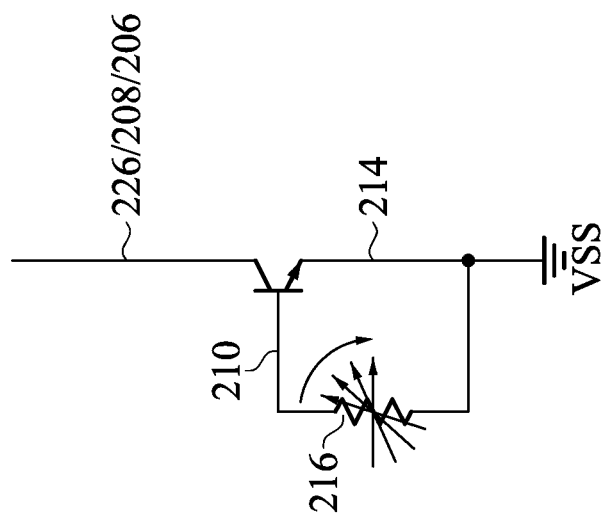
FIG. 5 is an effective circuit diagram of one embodiment of an ESD protection device as shown in FIG. 4.

FIG. 4 is a cross section of another embodiment of an electrostatic discharge (ESD) protection device 500b of the invention. FIG. 5 is an effective circuit diagram of one embodiment of an ESD protection device 500b as shown in FIG. 4. In this embodiment, the ESD protection device 500b may serve as a gate grounded NMOS (GGNMOS). One of the differences between the ESD protection devices 500a and 500b is that a drain doped region 226 of the ESD protection device 500b has the second conductive type such as N-type. For example, a drain doped region 226 of the ESD protection device 500b serves as an N-type heavily doped (N+) drain region. As shown in FIGS. 4 and 5, the drain doped region 226 (e.g. N+ drain region), the first doped region 208 (e.g. N-type drift drain doped region), the first well 206 (e.g. HVHW), the second doped region 210 (e.g. P-type body doped region), and the source doped region 214 (e.g. N+ source region) collectively construct a parasitic NPN bipolar junction transistor (NPN BJT). The drain doped region 226 (e.g. N+ drain region), the first doped region 208 (e.g. N-type drift drain doped region and the first well 206 (e.g. HVHW) may collectively serve as a collector of the parasitic NPN BJT. The second doped region 210 (e.g. P-type body doped region) may serve as a base of the parasitic NPN BJT. The source doped region 214 (e.g. N+ source region) may serve as an emitter of the parasitic NPN BJT. Further, the collector of the parasitic NPN BJT is coupled to the operation voltage (VDD) of a device, and the emitter of the parasitic NPN BJT is coupled to the ground reference voltage (VSS). Additionally, the first pick-up doped region 216 not covered by the extended portion 230 of the source contact plug 218 may serve as an adjustable parasitic resistor, and two terminals of the adjustable parasitic resistor are respectively electrically connected to the emitter and the base of the parasitic NPN BJT, which collectively serve as an cathode of the ESD protection device 500b.

Figure 6:
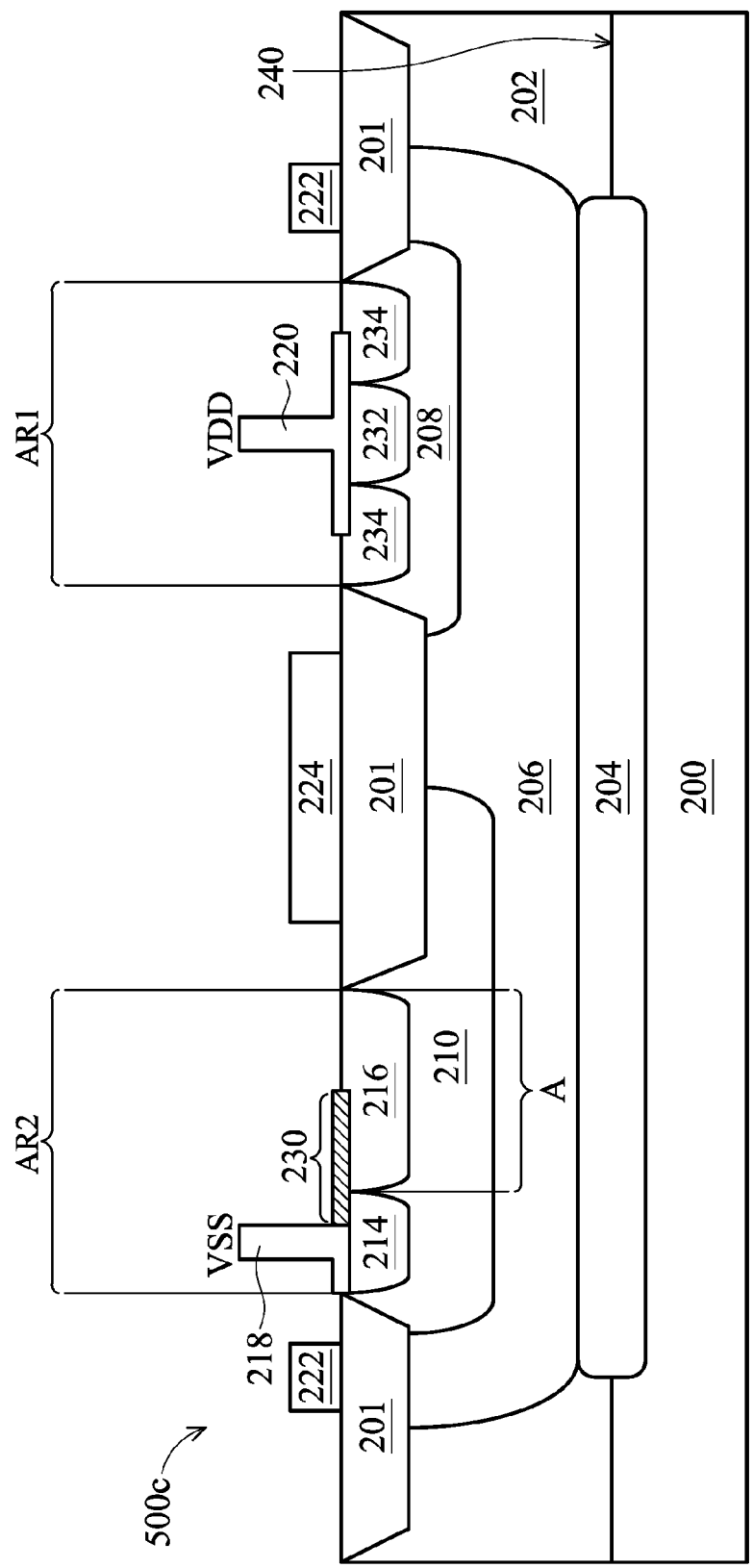
FIG. 6 is a cross section of yet another embodiment of an electrostatic discharge (ESD) protection device of the invention.
Figure 7:
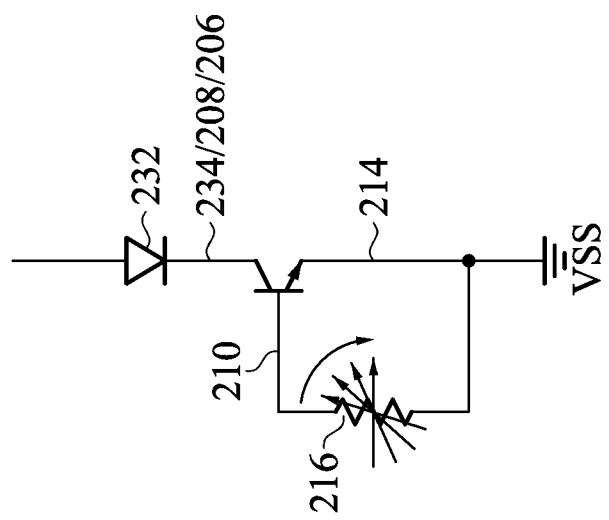
FIG. 7 is an effective circuit diagram of one embodiment of an ESD protection device as shown in FIG. 6.

FIG. 6 is a cross section of yet another embodiment of an electrostatic discharge (ESD) protection device 500c of the invention. FIG. 7 is an effective circuit diagram of one embodiment of an ESD protection device 500c as shown in FIG. 6. In this embodiment, the ESD protection device 500c may serve as a silicon controlled rectifier (NSCR) 500c. A drain doped region 232 of the ESD protection device 500b has the first conductive type such as P-type. For example, the drain doped region 232 of the ESD protection device 500c serves as a P-type heavily doped (P+) drain region. One of differences between the ESD protection devices 500a and 500c is that the ESD protection device 500c further comprises a second pick-up doped region 234 disposed in the first doped region 208, surrounding the drain doped region 232 from a top viewpoint. The second pick-up doped region 234 has the second conductive type such as N-type. For example, the second pick-up doped region 234 of the ESD protection device 500b serves as an N-type pick-up doped region 234. Alternatively, positions of the drain doped region 232 and the N-type pick-up doped region 234 can be exchanged. For example, the drain doped region 232 surrounds the second pick-up doped region 234. As shown in FIGS. 6 and 7, the drain doped region 232 (e.g. P+ drain region) and the second pick-up doped region 234 (e.g. N-type pick-up doped region) may collectively construct a P-N junction diode. Also, the drain doped region 232 connects to the operation voltage (VDD) of a device. Further, the first doped region 208 (e.g. N-type drift drain doped region), the first well 206 (e.g. HVHW), the second doped region 210 (e.g. P-type body doped region), and the source doped region 214 (e.g. N+ source region) collectively construct a parasitic NPN bipolar junction transistor (NPN BJT). The first doped region 208 (e.g. N-type drift drain doped region) and the first well 206 (e.g. HVHW) may serve as a collector of the parasitic NPN BJT. The second doped region 210 (e.g. P-type body doped region) may serve as a base of the parasitic NPN BJT. The source doped region 214 (e.g. N+ source region) may serve as an emitter of the parasitic NPN BJT. Further, the collector of the parasitic NPN BJT is coupled to the operation voltage (VDD) of a device, and the emitter of the parasitic NPN BJT is coupled to the ground reference voltage (VSS). Additionally, the first pick-up doped region 216 not covered by the extended portion 230 of the source contact plug 218 may serve as an adjustable parasitic resistor, and two terminals of the adjustable parasitic resistor are respectively electrically connected to the emitter and the base of the parasitic NPN BJT, which collectively serve as an cathode of the ESD protection device 500c.

Similarly, the differences between a trigger voltage and a holding voltage of the ESD protection device 500b or 500c may be adjustable by tuning the area of the first pick-up doped region 216 covered by the extended portion 230 of the source contact plug 218 to change the resistance value of the parasitic resistor connecting to the cathode of the ESD protection device 500b or 500c. Compared with the conventional ESD protection device, the ESD protection device 500b or 500c can improve the holding voltage and moderate the increase of the trigger voltage of the ESD protection device 500b or 500c without laminating several ESD protection devices. When the device is operated under a normal operation voltage, the ESD protection device 500b or 500c can avoid the situation where the device triggers the ESD protection device. Therefore, the ESD protection device 500b or 500c can avoid the situation where a latch-up phenomenon occurs, which damages the internal circuits of a device due to the triggered ESD protection device. The performances of the ESD protection device can be improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge (ESD) protection device, comprising:
    a semiconductor substrate having a first conductive type;
    an epitaxy layer disposed on the semiconductor substrate, wherein the epitaxy layer has the first conductive type;
    an isolation pattern disposed on the epitaxy layer to define a first active region and a second active region;
    a first well region disposed in the epitaxy layer, surrounding the first active region and the second active region, wherein the first well has a second conductive type opposite to the first conductive type;
    a gate structure disposed on the isolation pattern, between the first active region and the second active region;
    a first doped region disposed in the first active region, on the first well, wherein the first doped region has the second conductive type;
    a second doped region disposed in the second active region, on the first well, wherein the second doped region has the first conductive type;
    a drain doped region disposed in the first doped region;
    a source doped region and a first pick-up doped region adjacent to each other disposed in the second doped region, wherein the source doped region has the second conductive type, and the first pick-up doped region has the first conductive type; and
    a source contact plug connecting to the source doped region, wherein the source contact plug has an extended portion, and a ratio of an area of the first pick-up doped region covered by the extended portion to an area of first pick-up doped region is between zero and one from a top viewpoint.

2. The ESD protection device as claimed in claim 1, wherein the first conductive type is P-type and the second conductive type is N-type.

3. The ESD protection device as claimed in claim 2, wherein the drain doped region has the first conductive type.

4. The ESD protection device as claimed in claim 2, wherein the drain doped region has the second conductive type.

5. The ESD protection device as claimed in claim 2, further comprising a second pick-up doped region disposed in the first doped region, surrounding the source doped region, wherein the drain doped region has the first conductive type, and the second pick-up doped region has the second conductive type.

6. The ESD protection device as claimed in claim 1, wherein an area of the first pick-up doped region is larger than that of the source doped region from the top viewpoint.

7. The ESD protection device as claimed in claim 1, wherein the gate is disposed within a boundary of the isolation pattern.

8. The ESD protection device as claimed in claim 1, wherein the first doped region and the second doped region respectively extends under the isolation pattern.

9. The ESD protection device as claimed in claim 1, further comprising a buried layer disposed on an interface between the semiconductor substrate and the epitaxy layer, connecting to a bottom of the first well, wherein the buried layer has the second conductive type.

10. The ESD protection device as claimed in claim 2, wherein the first doped region, the first well, the second doped region, and the source doped region collectively construct an NPN bipolar junction transistor, wherein the first doped region and the first well are a collector of the NPN bipolar junction transistor, the second doped region is a base of the NPN bipolar junction transistor, and the source doped region is an emitter of the NPN bipolar junction transistor.

11. The ESD protection device as claimed in claim 10, wherein the first pick-up doped region not covered by the extended portion is an adjustable resistor, and two terminals of the adjustable resistor respectively electrically connect to the emitter and the base of the NPN bipolar junction transistor.

* * * * *